United States Patent
Charles et al.

(10) Patent No.: US 10,365,309 B2
(45) Date of Patent: *Jul. 30, 2019

(54) METHOD AND APPARATUS FOR USING MODULE-LEVEL POWER ELECTRONICS DATA FOR VALIDATING DISTRIBUTED ENERGY RESOURCE SYSTEM PARAMETERS

(71) Applicant: Enphase Energy, Inc., Petaluma, CA (US)

(72) Inventors: Nathan Charles, Lancaster, PA (US); Benjamin Lewis Smith, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 45 days.

This patent is subject to a terminal disclaimer.

(21) Appl. No.: 15/383,619

(22) Filed: Dec. 19, 2016

(65) Prior Publication Data

US 2017/0176504 A1 Jun. 22, 2017

Related U.S. Application Data

(60) Provisional application No. 62/268,920, filed on Dec. 17, 2015.

(51) Int. Cl.
*G01R 21/133* (2006.01)
*H02S 50/10* (2014.01)
(Continued)

(52) U.S. Cl.
CPC .............. *G01R 21/133* (2013.01); *G01W 1/12* (2013.01); *H02S 40/32* (2014.12); *H02S 50/10* (2014.12)

(58) Field of Classification Search
None
See application file for complete search history.

(56) References Cited

U.S. PATENT DOCUMENTS 9,847,749 B2 * 12/2017 Kiani ...................... H02S 20/32
2004/0060590 A1 * 4/2004 Ojima ...................... F24J 2/541
136/244

(Continued)

OTHER PUBLICATIONS

U.S. Appl. No. 62/362,676.

*Primary Examiner* — Tung S Lau
(74) *Attorney, Agent, or Firm* — Moser Taboada

(57) ABSTRACT

A method and apparatus for validating distributed energy resource as-designed parameters. In one embodiment the method comprises obtaining, from MLPE coupled to a PV module of the DER, data corresponding to sunrise on a particular day; obtaining, from MLPE, data corresponding to sunset on the particular day; determining, by the computer system and using the data corresponding to the sunrise and the data corresponding to the sunset, (i) the length of the particular day and (ii) the solar noon for the particular day; computing, by the computer system and using the length of the particular day and the solar noon for the particular day, an as-built latitude for the PV module and an as-built longitude for the PV module; and comparing, by the computer system, (a) the as-built latitude to an as-designed latitude for the PV module, and (b) the as-built longitude to an as-designed longitude for the PV module.

20 Claims, 7 Drawing Sheets

(51) Int. Cl.
   *H02S 40/32*      (2014.01)
   *G01W 1/12*       (2006.01)

(56)         References Cited

U.S. PATENT DOCUMENTS

2007/0084502 A1*  4/2007  Kelly ..................... F24J 2/38
                                                  136/246
2010/0024805 A1*  2/2010  Raymond ............... F24J 2/067
                                                  126/683
2011/0094503 A1*  4/2011  Jones ..................... F24J 2/38
                                                  126/714
2013/0086761 A1*  4/2013  Singh ................... B08B 1/008
                                                  15/77
2014/0166076 A1*  6/2014  Kiani .................... E04H 4/14
                                                  136/246
2018/0034411 A1*  2/2018  Charles ................ H02S 50/10

* cited by examiner

METHOD AND APPARATUS FOR USING MODULE-LEVEL POWER ELECTRONICS DATA FOR VALIDATING DISTRIBUTED ENERGY RESOURCE SYSTEM PARAMETERS

CROSS-REFERENCE TO RELATED APPLICATIONS

This application claims benefit of U.S. provisional patent application Ser. No. 62/268,920, filed Dec. 17, 2015, which is herein incorporated in its entirety by reference.

BACKGROUND

Field

Embodiments of the present disclosure generally relate to a method and apparatus for validating distributed energy resource (DER) as-designed parameters.

Description of the Related Art

Use of distributed energy resources (DERs) to produce energy from renewable resources is steadily gaining commercial acceptance due to the rapid depletion of existing fossil fuels and the increasing costs of current methods of generating power. One such type of DER is a solar power system comprising multiple photovoltaic (PV) modules that convert received solar power into a direct current (DC). In some solar power systems, module-level power electronics (e.g., DC-DC converters or DC-AC module-level power electronics) are coupled to each PV module for converting the DC current into an output current which may then be used to run appliances at a home or business, sold to a commercial power company, or stored for later use.

When evaluating the performance of a DER, actual energy production versus expected energy production is typically compared. However, expected energy production can often be significantly biased when systems are built or installed with configurations differing from what was designed. Such differences may result in significant variations in data used in computing DER system parameters, such as expected energy production.

Therefore, there is a need in the art for efficiently validating DER as-designed parameters.

SUMMARY

Embodiments of the present invention generally relate to a method and apparatus for validating distributed energy resource (DER) as-designed parameters substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to a method and apparatus for using module-level power electronics (MLPE) located proximate one or more photovoltaic (PV) modules of a distributed energy resource (DER) to validate at least one system parameter of the DER. The validated data may subsequently be used to compute operating characteristics of the DER under real-world operating conditions. In some embodiments, such as the embodiment described below, the MLPE is a DC-AC power conditioner (which may also be referred to as a microinverter or simply inverter) that is coupled to a PV module, although in other embodiments the MLPE may be another type of power conditioner such as a DC-DC converter. The MLPE measures parameters such as temperature, DC current and DC voltage, and some or all of such MLPE data is time-stamped and used in validating at least one DER system parameter. The validated data may subsequently be used to compute operating characteristics of the DER under real-world operating conditions. Examples of computing DER operating characteristics may be found in commonly assigned U.S. provisional patent application Ser. No. 62/362,676, entitled "Method and Apparatus for Determining Key Performance Photovoltaic Characteristics Using Sensors from Module-Level Power Electronics" and filed Jul. 15, 2016, which is which is herein incorporated in its entirety by reference.

In one or more embodiments, by using a time series of raw inverter data (i.e., MLPE data), several methods can be used to infer the latitude, longitude, azimuth, and tilt of the photovoltaic (PV) module and inverter pair the data was sourced from. Various methods can be used to confirm whether "as built" significantly varies from "as designed", and whether Installer-provided location and orientation metadata seems correct. Confirmation of system metadata can help ensure system performance expectations are reasonable. When performing fleet analysis for a variety of reasons, this can help increase the accuracy and confidence of system expected performance data.

Figure 1:
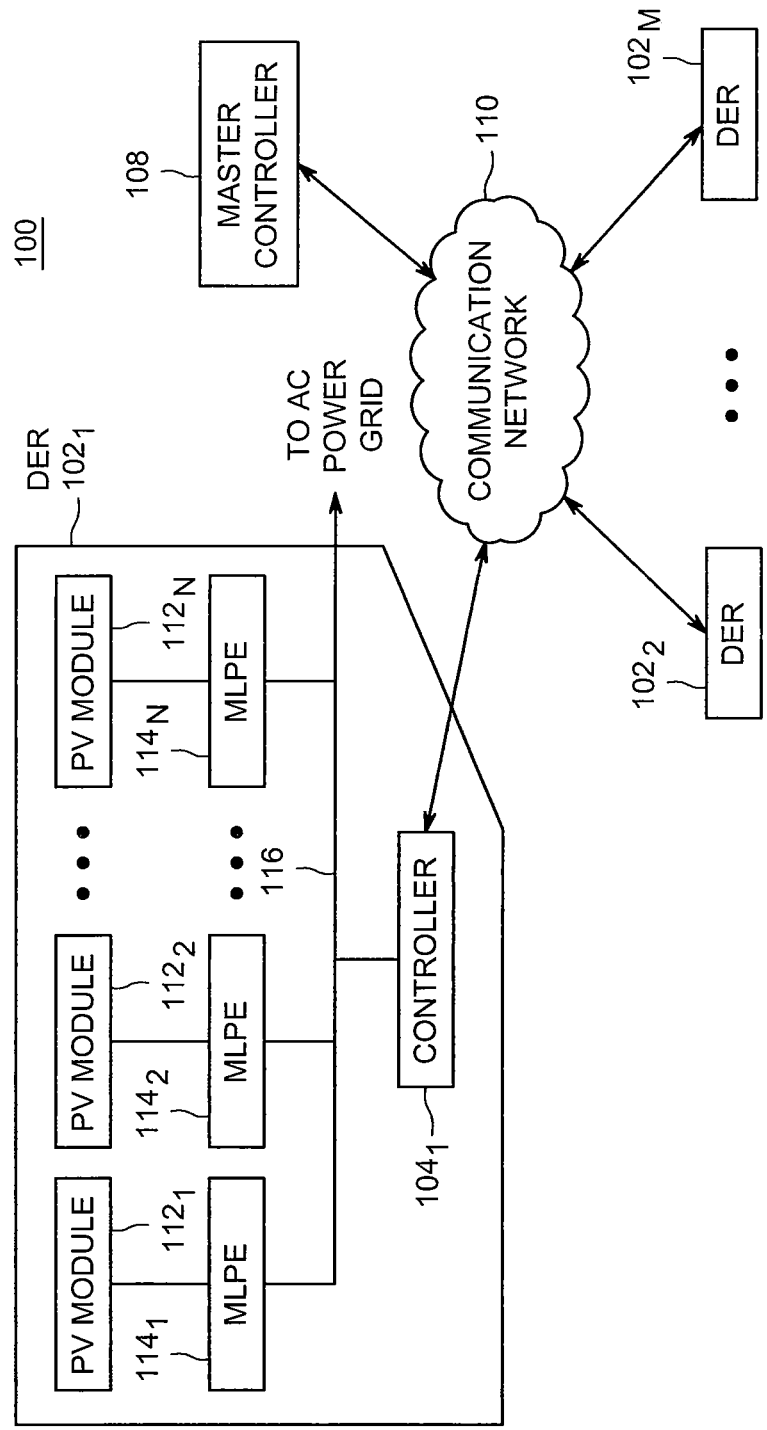
FIG. 1 is a block diagram of a distributed energy generation system in which the cost of scheduling of component maintenance is optimized in accordance with one or more embodiments of the present invention.

FIG. 1 is a block diagram of a power generation system 100 ("system 100") in accordance with one or more embodiments of the present invention. The system 100 comprises a plurality of distributed energy resources (DERs) $102_1$, $102_2$, ..., $102_M$, (collectively referred to as DERs 102), a plurality of controllers $104_1$, $104_2$, ..., $104_n$, (collectively referred to as controllers 104), a master controller 108, and a communications network 110. Each of the DERs 102 is communicatively coupled to a corresponding controller 104, which are communicatively coupled to the master controller 108 via the communication network 110 (e.g., the Internet). Although only the DER 102$_1$ is depicted in detail in FIG. 1 and described herein, the DERs 102-2 through 102$_M$ are analogous to the DER 102$_1$, although the number and/or type of various DER components may vary.

The DERs 102 each comprise a plurality of PV modules 112$_1$, 112$_2$, . . . , 112$_n$, (collectively referred to as PV modules 112) which generate DC power from solar energy. In some embodiments, one or more of the DERs 102 may additionally or alternatively comprise other types of renewable energy sources, such as for wind energy, hydroelectric energy, and the like, for generating DC power.

Each of the DERs 102 further comprises a plurality of module-level power electronics 114$_1$, 114$_2$, . . . , 114$_n$, (collectively referred to as module-level power electronics 114, MLPE 114, or simply power electronics 114). Each of the module-level power electronics 114$_1$, 114$_2$, . . . 114$_n$ is coupled to a PV module 112$_1$, 112$_2$, . . . 112$_n$, respectively, in a one-to-one correspondence.

In some embodiments, the module-level power electronics 114 may be DC-AC inverters that convert DC power from the corresponding PV modules 112 to grid-compliant AC power and couple the generated power to an AC bus 116 that is coupled to one or more of an AC power grid (e.g., a commercial AC power grid), loads, a system for power storage, and the like. In other embodiments, each of the module-level power electronics 114 may be another type of power converter or power conditioner, such as DC-DC converters. Each of the module-level power electronics 114 comprises components for measuring local parameters such as temperature, DC current input, DC voltage input, and the like. Such measured parameters may be referred to herein as MLPE data.

The controller 104-1 is also coupled to the AC bus 116-1 (which may also be referred to as a "local grid"). Generally, the controller 104-1 communicates with the power electronics 114 via the AC bus 116-1 using power line communications (PLC), although additionally or alternatively other types of wired communication and/or wireless communication may be used. Each of the controllers 104 collects information regarding the health and performance of components of the corresponding DER 102, such as measurements of power generated by the corresponding power electronics 114, power consumed from one or more components of the DER 102, deactivation of the components, alarm and alert messages, and the like. Some or all of the information may be collected periodically or in real-time.

The collected information is communicated from the controllers 104 to the master controller 108 where it may be analyzed and/or reported in real time; additionally or alternatively some or all of the received information may be stored for subsequent data analysis and/or report generation. In some embodiments, some or all of the collected information may be communicated in real-time to the master controller 208.

In addition to receiving information from the power electronics 114, the controllers 104 and/or the master controller 108 may communicate information to the power electronics 114, such as control and command instructions.

For each of the PV modules 112, latitude and longitude values are determined using a computed value for the length of the day based on MLPE data from the corresponding power electronics 114. The computed length of day is determined as the difference in time between the first-of-day measured DC voltage from the power electronics 114 (i.e., the DC voltage measured when the power electronics 114 initially "wakes up" as a result of the solar radiation at sunrise on the PV module 112 causing a DC current to the power electronics 114) and the last-of-day measured DC voltage from the power electronics 114 at the end of the day (i.e., the DC voltage measured when the power electronics 114 shuts down as a result of the lack of solar radiation on the PV module 112 at sunset). The difference between the timestamps of the measured first-of-day MLPE voltage (which may also be referred to as the sunrise MLPE voltage) and the last-of-day MLPE voltage (which may also be referred to as the sunset MLPE voltage) for a particular day provides the computed length of day for that day, although in some alternative embodiments the length of day may be computed by additionally or alternatively using other MLPE data (such as measured DC current, measured AC voltage, measured AC current, or the like).

In addition to the computed length of day for a particular day, the corresponding solar noon can be computed as the midpoint of the computed length of day. Based on the computed length of day for a given day, the latitude of the PV module 112/power electronics 114 can be computed using known mathematical relationships between latitude and length of day for that particular day of the year. The longitude of the PV module 112/power electronics 114 can then be computed based the computed solar noon.

The computed latitude and longitude (which may also be referred to as the "as-built" latitude and longitude or the inferred latitude and longitude) for the PV module 112/power electronics 114 can then be compared with the "as-designed" latitude and longitude (i.e., the latitude and longitude at which the PV module 112/power electronics 114 was designed to be installed). In some embodiments, the as-designed latitude and longitude are considered validated when the difference between the as-built latitude and longitude and the as-designed latitude and longitude are within a margin of error, for example within 1%. When the as-designed latitude and longitude and the as-built latitude and longitude for the PV modules 112/power electronics 114 are within a margin of error, the as-designed parameters are considered validated and can be used with confidence in system computations that are dependent on latitude and longitude (e.g., expected power yield and the like). When the as-designed latitude and longitude and the as-built latitude and longitude for the PV modules 112/power electronics 114 are not within the margin of error, the as-built latitude and longitude can be used in place of the as-designed values in DER system computations. In some embodiments, the as-built values may be used in the DER system computations regardless of whether the as-designed and as-built values are within a margin of error.

In some embodiments, the computed latitude and longitude may be obtained using MLPE data for a single day, while in other embodiments the computed latitude and longitude may be obtained based on data from multiple days. For example, MLPE data obtained over multiples days may be used to determine multiple computed latitude and longitude, which are then averaged to obtain the as-built latitude and longitude.

In some embodiments, the as-designed latitude and longitude may be validated after system installation and turn-up; in other embodiments, the as-designed latitude and longitude may be periodically validated through the system's life cycle.

Figure 5:
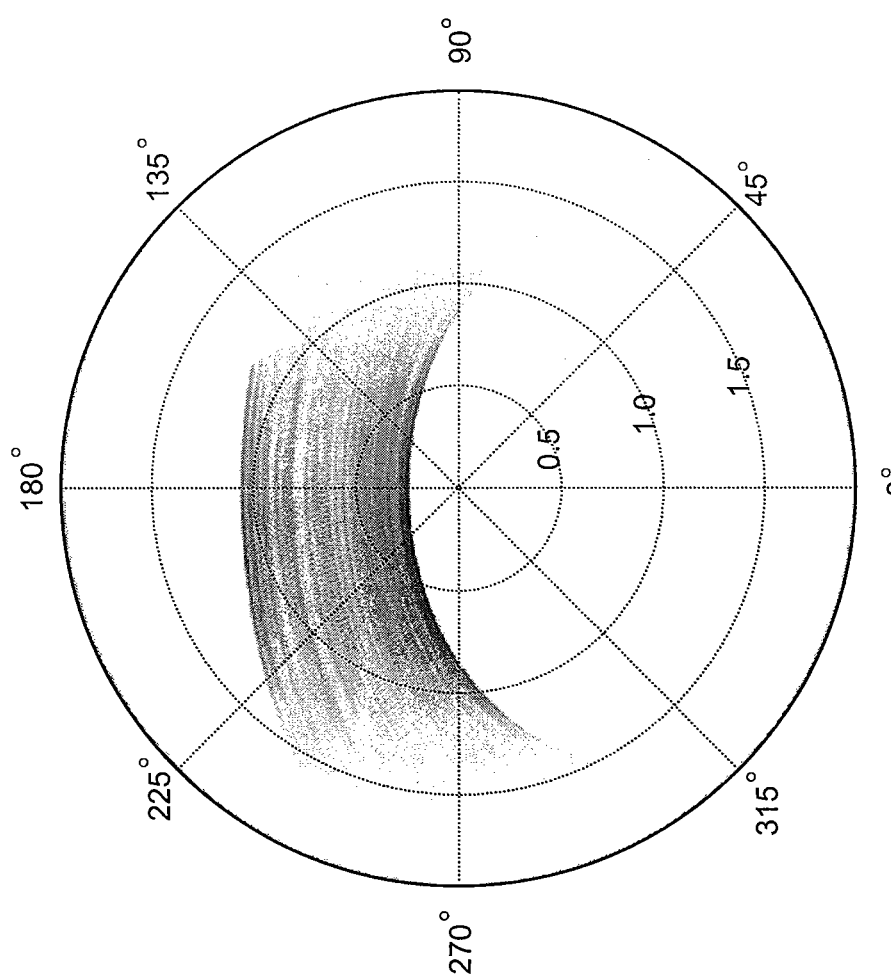
FIG. 5 depicts an example of a module-level power electronics (MLPE) data plot for determining shading.
Figure 6:
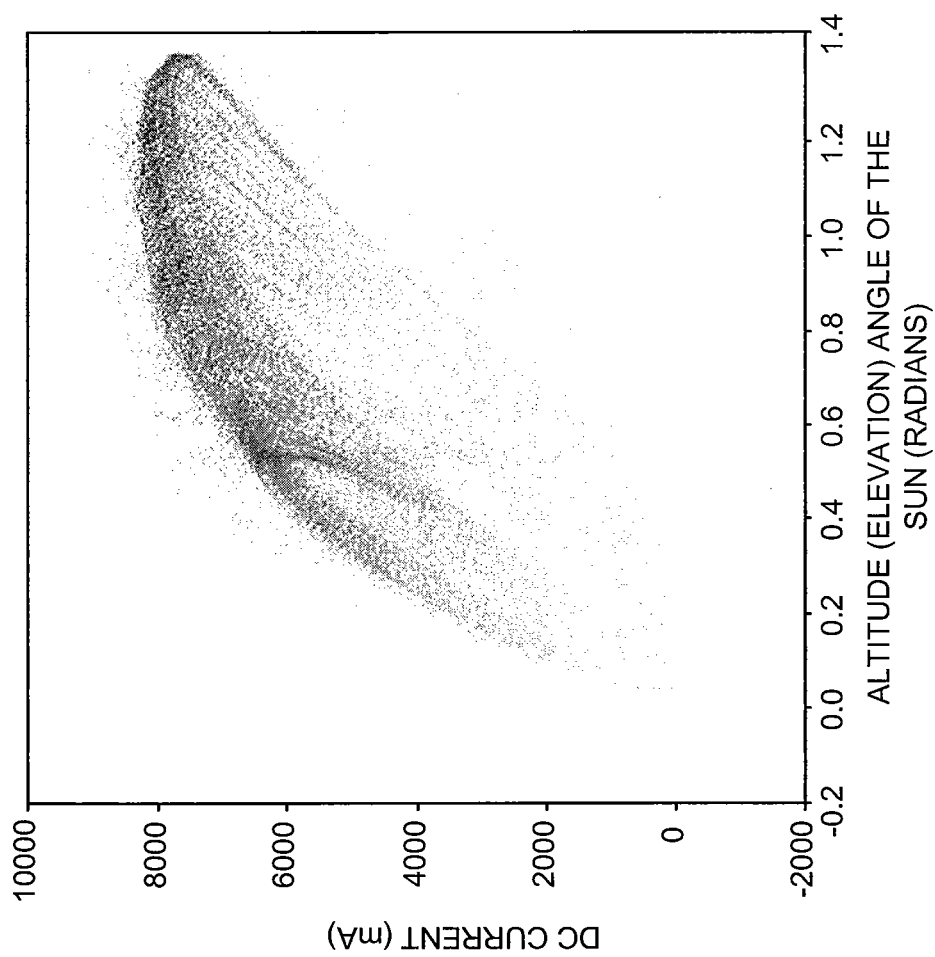
FIG. 6 depicts an example of an MPLE data plot for determining module tilt.
Figure 7:
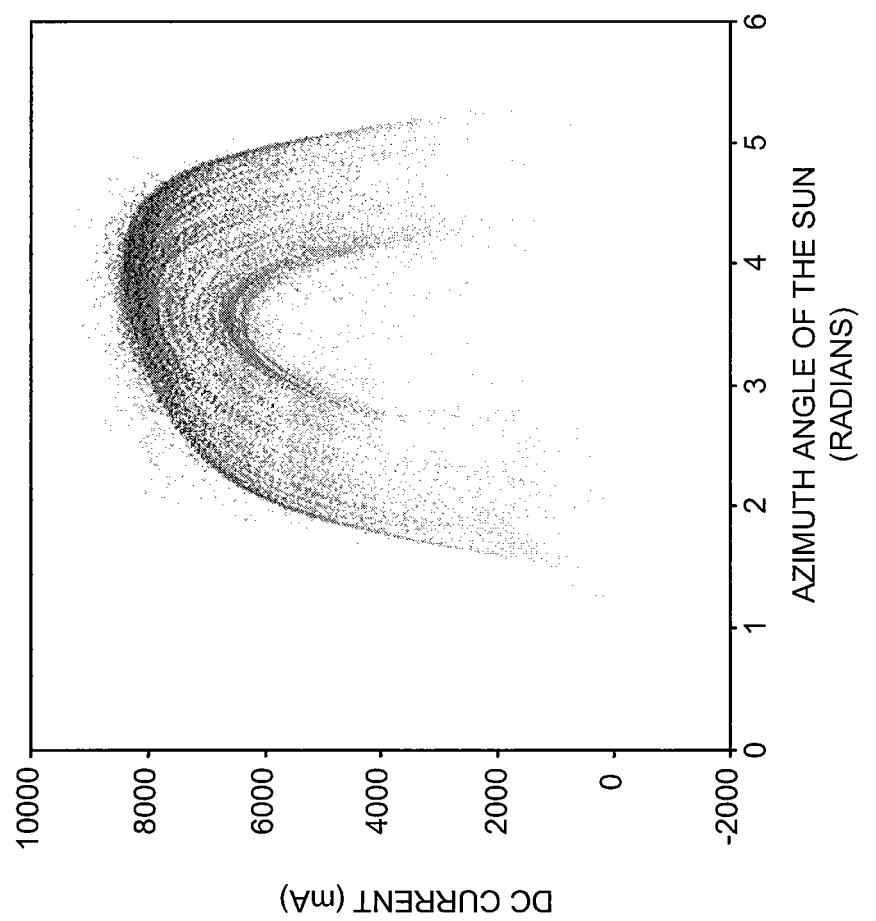
FIG. 7 depicts an example of an MPLE data plot for determining module azimuth.

In addition to obtaining computed latitude and longitude, other data pertaining to the PV modules 112 may be inferred from MLPE data, such as shade (e.g., based on solar position versus measured DC current), tilt (e.g., based on comparison of DC current versus the PV module altitude and the angle of the sun) and azimuth (e.g., based on a comparison of DC current values and the corresponding azimuth angle of the sun at the time each DC current value was generated). FIGS. 5, 6 and 7 depict examples of MLPE data plots for determining shading, module tilt, and module azimuth, respectively. Some or all of such inferred data may also be compared to as-designed values for validation and/or used in computing system data (e.g., expected power yield and the like).

In some embodiments, the data analysis described herein may be performed at the master controller 108 (which may reside in a location such as a network operations center, or NOC), although in other embodiments the data analysis may be performed at another controller such as the controller 104 or a controller "in the cloud" (not shown). In one or more embodiments, a computer readable medium comprises a program that, when executed by a processor, performs the processing described herein.

Additional data may also be used in the data analysis described herein, such as clear sky irradiance models (e.g., the Haurwitz clear sky model, the Ineichen clear sky model, and the like), cloud models, weather station data, GPS data, virtual irradiance models, and the like. In some embodiments, one or more clear sky models may be used in validating site metadata such as tilt, azimuth and location.

Figure 2:
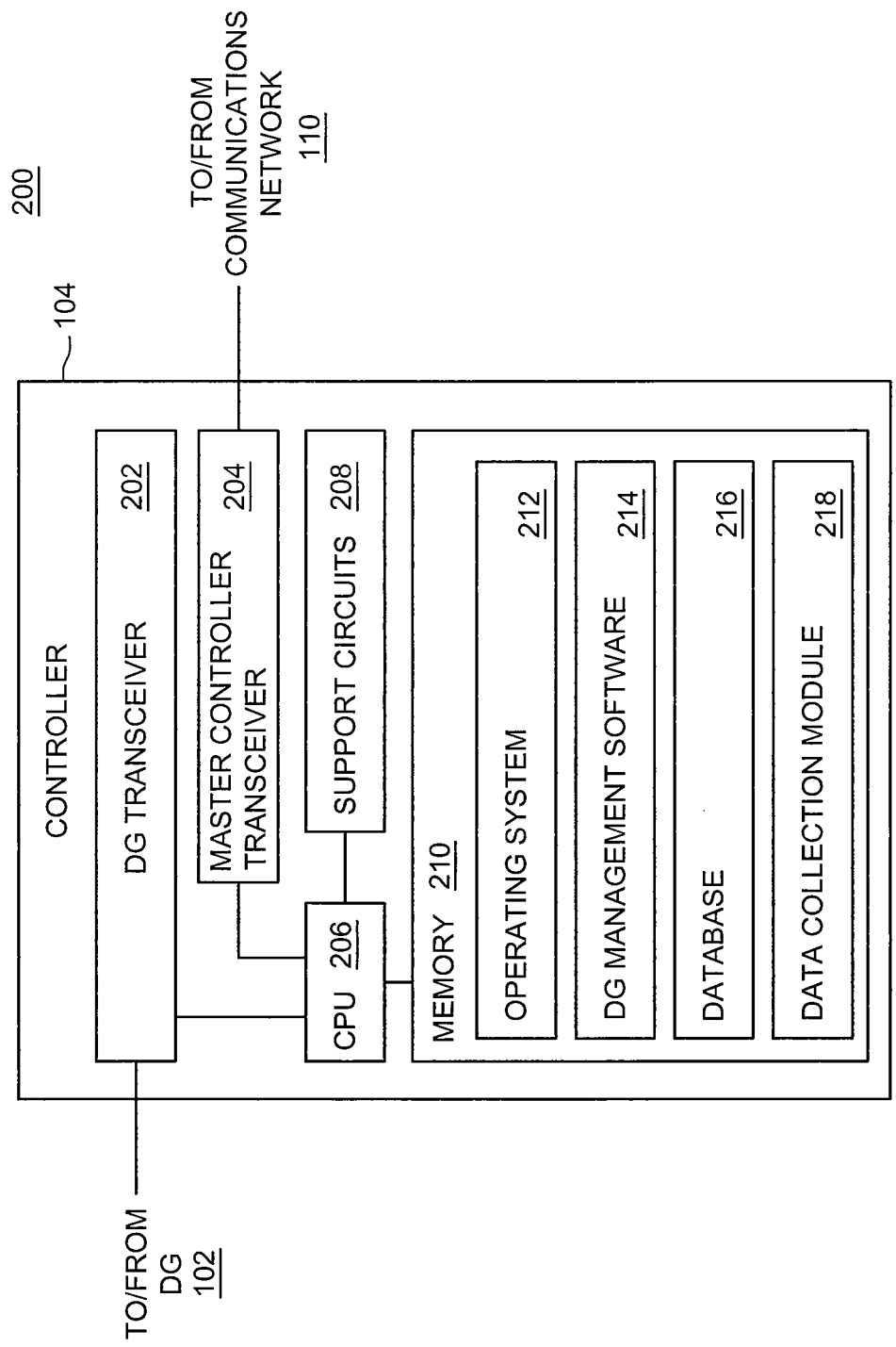
FIG. 2 is a block diagram of a controller in accordance with one or more embodiments of the present invention.

FIG. 2 is a block diagram of a controller 104 in accordance with one or more embodiments of the present invention. The controller 104 comprises a distributed generator (DER) transceiver 202, a master controller transceiver 204, at least one central processing unit (CPU) 206, support circuits 208, and a memory 210. The CPU 206 is coupled to the DER transceiver 202, the master controller transceiver 204, the support circuits 208, and the memory 210, and may comprise one or more conventionally available processors, microprocessors, microcontrollers, digital signal processors, and/or combinations thereof configured to execute non-transient software instructions to perform various tasks in accordance with the present invention. Additionally, the CPU 206 may include one or more application specific integrated circuits (ASICs). In one or more other embodiments, the CPU 206 may be a microcontroller comprising internal memory for storing controller firmware that, when executed, provides the functionality described herein.

The support circuits 208 are well known circuits used to promote functionality of the CPU 206. Such circuits include, but are not limited to, a cache, power supplies, clock circuits, buses, network cards, input/output (I/O) circuits, and the like. The controller 104 may be implemented using a general purpose computer that, when executing particular software, becomes a specific purpose computer for performing various embodiments of the present invention.

The DER transceiver 202 communicates with power electronics 114 to obtain MLPE data (such as measured DC current values, measured DC voltage values, measured temperature values, health and performance information, and the like) and also may provide control instructions to the power electronics 114. In some embodiments, the controller 104 may use Power Line Communications (PLC) via the bus 116 for communicating with the power electronics 114. Additionally or alternatively, the controller 104 may communicate with the power electronics 114 other types of wired communication and/or wireless techniques, for example a WI-FI or WI-MAX modem, 3G modem, cable modem, Digital Subscriber Line (DSL), fiber optic, or similar type of technology.

The master controller transceiver 204 communicatively couples the controller 104 to the master controller 108 via the communications network 110 to facilitate the management of the DER 102 (e.g., providing the collected MLPE data to the master controller 108 and/or for receiving control information from the master controller 108). The master controller transceiver 204 may utilize wireless and/or wired techniques, for example a WI-FI or WI-MAX modem, 3G modem, cable modem, Digital Subscriber Line (DSL), fiber optic, PLC, or similar type of technology, for coupling to the network 110 to provide such communication.

The memory 210 may comprise random access memory, read only memory, removable disk memory, flash memory, and various combinations of these types of memory. The memory 210 is sometimes referred to as main memory and may, in part, be used as cache memory or buffer memory. The memory 210 generally stores an operating system 212 of the controller 104. The operating system 212 may be one of a number of commercially available operating systems such as, but not limited to, SOLARIS from SUN® Microsystems, Inc., AIX® from IBM® Inc., HP-UX from Hewlett Packard Corporation, LINUX from Red Hat Software, Real-Time Operating System (RTOS), WINDOWS 2000 from Microsoft Corporation, and the like.

The memory 210 stores non-transient processor-executable instructions and/or data that may be executed by and/or used by the CPU 206. These processor-executable instructions may comprise firmware, software, and the like, or some combination thereof. The memory 210 stores various forms of application software, such as DER management software 214 for managing the DER 102 and its components, as well as a database 216 for storing data pertaining to the DER 102 (e.g., health and performance data from the DER 102, collected MLPE data, and the like).

The memory 210 further comprises a data collection module 218 for collecting MLPE data. The MLPE data may be collected in real time (i.e., as it is generated) and/or periodically. The MLPE data may be communicated to the master controller 108 as it is collected; additionally or alternatively, some or all of the MLPE data may be stored in the database 216 for subsequent use.

Figure 3:
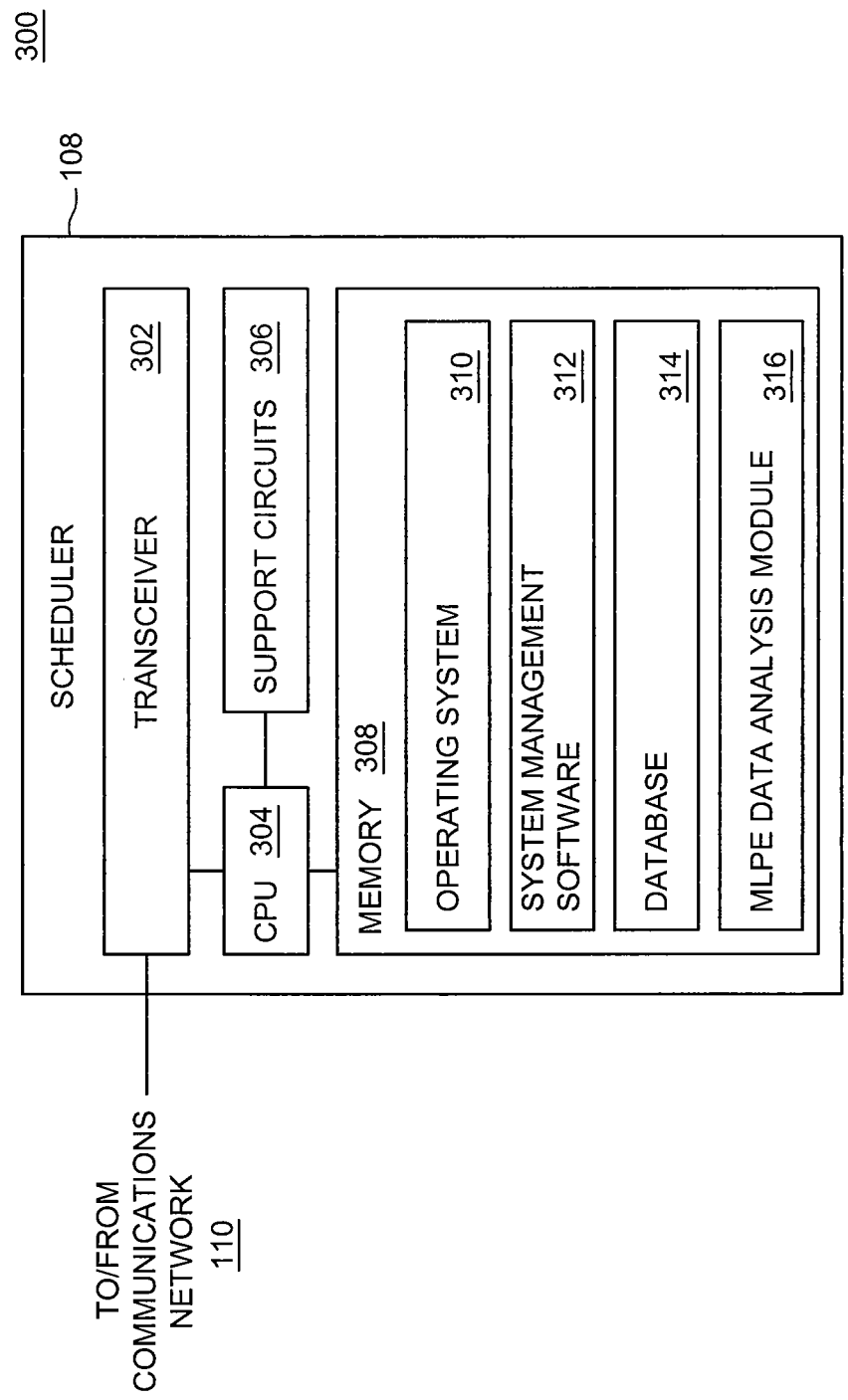
FIG. 3 is a block diagram of a scheduler in accordance with one or more embodiments of the present invention.

FIG. 3 is a block diagram of a master controller 108 in accordance with one or more embodiments of the present invention. The master controller 108 comprises a transceiver 302, support circuits 306, and a memory 308 coupled to at least one central processing unit (CPU) 304. The CPU 304 may comprise one or more conventionally available processors, microprocessors, microcontrollers, digital signal processors, and/or combinations thereof configured to execute non-transient software instructions to perform various tasks in accordance with the present invention. Alternatively, the CPU 304 may include one or more application specific integrated circuits (ASICs). In one or more other embodiments, the CPU 304 may be a microcontroller comprising internal memory for storing controller firmware that, when executed, provides the functionality described herein.

The support circuits 306 are well known circuits used to promote functionality of the CPU 304. Such circuits include, but are not limited to, a cache, power supplies, clock circuits, buses, network cards, input/output (I/O) circuits, and the like.

The master controller 108 may be implemented using a general purpose computer that, when executing particular software, becomes a specific purpose computer for performing various embodiments of the present invention.

The transceiver 302 communicatively couples the master controller 108 to the controllers 104 via the communications network 110 to monitor and/or provide control to the DERs 102, for example for receiving health and performance information pertaining to the DER 102, issuing control instructions the controllers 104 and/or the power electronics 114, and the like. Additionally, the master controller 108 receives collected MLPE data from the controller 104 such as measured DC current values, measured DC voltage values, measured temperature values, and the like. The transceiver 302 may utilize wireless and/or wired techniques, for example a WI-FI or WI-MAX modem, 3G modem, cable modem, Digital Subscriber Line (DSL), fiber optic, PLC or similar type of technology, for coupling to the network 110 to provide such communication.

The memory 308 may comprise random access memory, read only memory, removable disk memory, flash memory, and various combinations of these types of memory. The memory 308 is sometimes referred to as main memory and may, in part, be used as cache memory or buffer memory. The memory 308 generally stores an operating system 310 of the master controller 108. The operating system 310 may be one of a number of commercially available operating systems such as, but not limited to, SOLARIS from SUN® Microsystems, Inc., AIX® from IBM® Inc., HP-UX from Hewlett Packard Corporation, LINUX from Red Hat Software, Real-Time Operating System (RTOS), Windows 2000 from Microsoft Corporation, and the like. The memory 308 stores non-transient processor-executable instructions and/or data that may be executed by and/or used by the CPU 304. These processor-executable instructions may comprise firmware, software, and the like, or some combination thereof.

The memory 308 may store various forms of application software, such as system management software 312 for managing the DERs 102, as well as various databases, such as a database 314 for storing data related to the system 100 and/or the present invention, such as irradiance models, as-designed information, weather station information, GPS information, and the like. All or some of the data stored in the database 314 may be periodically updated.

The memory 308 further stores an MLPE data analysis module 316 for analyzing the MLPE data and validating various as-designed DER parameters as described herein.

Figure 4:
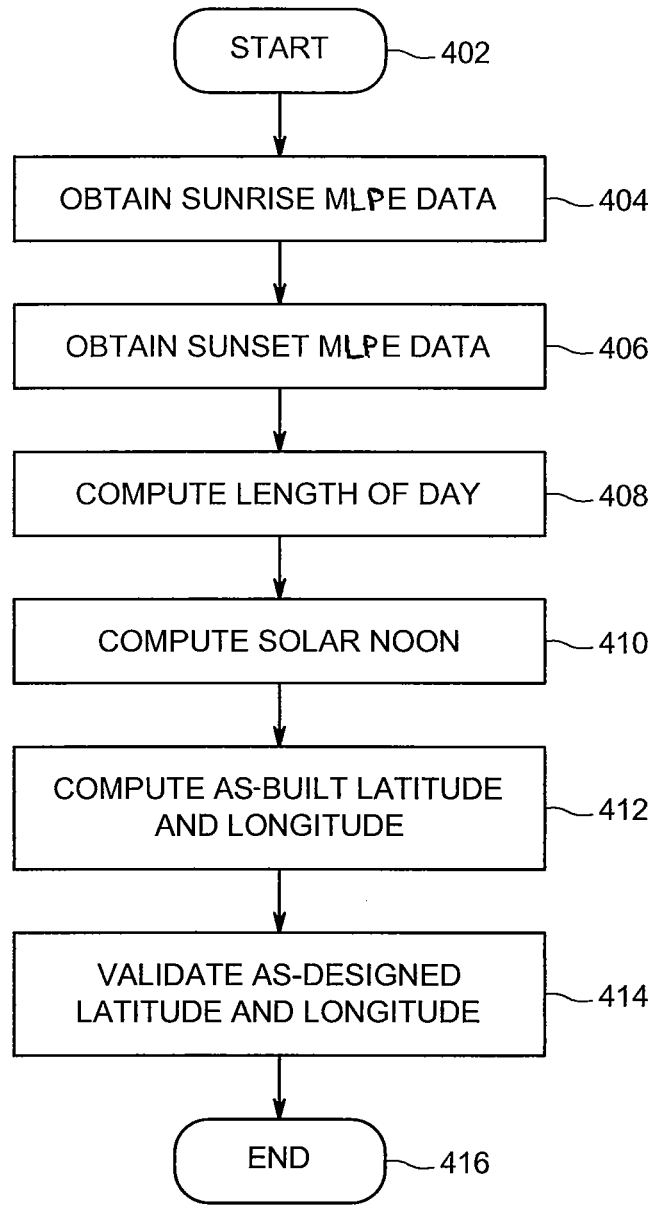
FIG. 4 is a flow diagram of a method for optimizing the cost of scheduling maintenance of alternative energy systems, in accordance with one or more embodiments of the present invention.

FIG. 4 is a flow diagram of a method 400 for validating DER system parameters in accordance with one or more embodiments of the present invention. In some embodiments, such as the embodiment described below, MLPE data from a DER comprising a plurality of PV modules coupled to power electronics, such as the DERs 102, is analyzed for validating latitude and longitude parameters for the DER. In other embodiments, the MLPE data may be used to additionally or alternatively compute and/or validate other DER system parameters, such as shading, tilt, azimuth, and the like.

In some embodiments, a computer readable medium comprises a program that, when executed by a processor, performs the method 400.

The method 400 begins at step 402 and proceeds to step 404. At step 404, MLPE data corresponding to sunrise for a particular day is obtained. In some embodiments, the first DC voltage measured by the power electronics for a particular day is used as the sunrise MLPE data. In other embodiments, other types of MLPE data corresponding to the beginning of power generation by the PV module may be used as the sunrise MLPE data.

The method 400 proceeds to step 406. At step 406, MLPE data corresponding to sunset for the same day is obtained. In some embodiments, the last DC voltage measured by the power electronics for that day is used as the sunset MLPE data. In other embodiments, other types of MLPE data corresponding to the end of power generation by the PV module may be used as the sunset MLPE data.

At step 408, the sunrise and sunset MLPE data is used to compute the length of the day by determining the difference in the timestamps of each. The method 400 proceeds to step 410. At step 410, solar noon for the day is computed as the midpoint of the length of the day. The method 400 proceeds to step 412.

At step 412, the latitude of the PV module and corresponding power electronics from which the MLPE data was obtained is computed using known mathematical relationships between latitude and length of day for that particular day of the year. At step 414, the longitude of the PV module and corresponding power electronics from which the MLPE data was obtained is computed using the computed solar noon. The method 400 proceeds to step 414.

At step 414, the computed latitude and longitude (i.e., the as-built latitude and longitude) is compared to the as-designed latitude and longitude to validate the as-designed latitude and longitude. In some embodiments, the as-designed latitude and longitude are considered validated when the difference between the as-built latitude and longitude and the as-designed latitude and longitude are within a margin of error, for example within 1%. When the as-designed latitude and longitude and the as-built latitude and longitude are within the margin of error, the as-designed parameters are considered validated and can be used with confidence in system computations that are dependent on latitude and longitude (e.g., expected power yield and the like). When the as-designed latitude and longitude and the as-built latitude and longitude are not within the margin of error, the as-built latitude and longitude can be used in place of the as-designed values in DER system computations. In some embodiments, the as-built values may be used in the DER system computations regardless of whether the as-designed and as-built values are within a margin of error.

The method 400 then proceeds to step 416 where it ends.

The foregoing description of embodiments of the invention comprises a number of elements, devices, circuits and/or assemblies that perform various functions as described. For example, the data collection module 218 is an example of a means for collecting operational data pertaining to the DER 102, and the optimization module 316 is an example of a means for optimizing the scheduling of maintenance for one or more DERs. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. A method for validating distributed energy resource (DER) as-designed parameters, the method being performed by a computer system comprising at least one processor, the method comprising:
   obtaining, from module level power electronics coupled to a photovoltaic (PV) module of the DER, data corresponding to sunrise on a particular day, wherein the data corresponding to the sunrise is based on a first measurement pertaining to the PV;

obtaining, from the module level power electronics, data corresponding to sunset on the particular day, wherein the data corresponding to the sunset is based on a second measurement pertaining to the PV;

determining, by the computer system and using the data corresponding to the sunrise and the data corresponding to the sunset, (i) the length of the particular day and (ii) the solar noon for the particular day;

computing, by the computer system and using the length of the particular day and the solar noon for the particular day, an as-built latitude for the PV module and an as-built longitude for the PV module; and comparing, by the computer system, (a) the as-built latitude to an as-designed latitude for the PV module, and (b) the as-built longitude to an as-designed longitude for the PV module.

2. The method of claim 1, further comprising:
computing, by the computer system, at least one system parameter of the DER using the as-designed latitude and the as-designed longitude when (1) the as-built latitude and the as-designed latitude are within a margin of error and (2) the as-built longitude and the as-designed longitude are within the margin of error.

3. The method of claim 2, further comprising:
computing, by the computer system, the at least one system parameter of the DER using the as-built latitude and the as-built longitude when (1) the as-built latitude and the as-designed latitude are not within the margin of error and (2) the as-built longitude and the as-designed longitude are not within the margin of error.

4. The method of claim 3, wherein the margin of error is 1%.

5. The method of claim 3, wherein the at least one system parameter is expected energy production.

6. The method of claim 1, wherein the module level power electronics is a DC-AC inverter.

7. The method of claim 1, wherein the data corresponding to the sunrise is a first-of-day measured DC voltage measured by the module level power electronics, and the data corresponding to the sunset is a last-of-day measured DC voltage measured by the module level power electronics.

8. Apparatus for validating distributed energy resource (DER) as-designed parameters, comprising:
a controller comprising at least one processor and a module level power electronics (MLPE) data analysis module for:
obtaining, from module level power electronics coupled to a photovoltaic (PV) module of the DER, data corresponding to sunrise on a particular day, wherein the data corresponding to the sunrise is based on a first measurement pertaining to the PV;
obtaining, from the module level power electronics, data corresponding to sunset on the particular day, wherein the data corresponding to the sunset is based on a second measurement pertaining to the PV;
determining, using the data corresponding to the sunrise and the data corresponding to the sunset, (i) the length of the particular day and (ii) the solar noon for the particular day;
computing, using the length of the particular day and the solar noon for the particular day, an as-built latitude for the PV module and an as-built longitude for the PV module; and
comparing (a) the as-built latitude to an as-designed latitude for the PV module, and (b) the as-built longitude to an as-designed longitude for the PV module.

9. The apparatus of claim 8, wherein the MLPE data analysis module further computes at least one system parameter of the DER using the as-designed latitude and the as-designed longitude when (1) the as-built latitude and the as-designed latitude are within a margin of error and (2) the as-built longitude and the as-designed longitude are within the margin of error.

10. The apparatus of claim 9, wherein the MLPE data analysis module further computes the at least one system parameter of the DER using the as-built latitude and the as-built longitude when (1) the as-built latitude and the as-designed latitude are not within the margin of error and (2) the as-built longitude and the as-designed longitude are not within the margin of error.

11. The apparatus of claim 10, wherein the margin of error is 1%.

12. The apparatus of claim 10, wherein the at least one system parameter is expected energy production.

13. The apparatus of claim 8, wherein the module level power electronics is a DC-AC inverter.

14. The apparatus of claim 8, wherein the data corresponding to the sunrise is a first-of-day measured DC voltage measured by the module level power electronics, and the data corresponding to the sunset is a last-of-day measured DC voltage measured by the module level power electronics.

15. A non-transitory computer readable medium containing computer instructions stored therein for causing a computer processor to perform a method for validating distributed energy resource (DER) as-designed parameters, the method comprising:
obtaining, from module level power electronics coupled to a photovoltaic (PV) module of the DER, data corresponding to sunrise on a particular day, wherein the data corresponding to the sunrise is based on a first measurement pertaining to the PV;
obtaining, from the module level power electronics, data corresponding to sunset on the particular day, wherein the data corresponding to the sunset is based on a second measurement pertaining to the PV;
determining, using the data corresponding to the sunrise and the data corresponding to the sunset, (i) the length of the particular day and (ii) the solar noon for the particular day;
computing, using the length of the particular day and the solar noon for the particular day, an as-built latitude for the PV module and an as-built longitude for the PV module; and
comparing (a) the as-built latitude to an as-designed latitude for the PV module, and (b) the as-built longitude to an as-designed longitude for the PV module.

16. The non-transitory computer readable medium of claim 15, wherein the method further comprises computing at least one system parameter of the DER using the as-designed latitude and the as-designed longitude when (1) the as-built latitude and the as-designed latitude are within a margin of error and (2) the as-built longitude and the as-designed longitude are within the margin of error.

17. The non-transitory computer readable medium of claim 15, wherein the method further comprises computing the at least one system parameter of the DER using the as-built latitude and the as-built longitude when (1) the as-built latitude and the as-designed latitude are not within the margin of error and (2) the as-built longitude and the as-designed longitude are not within the margin of error.

18. The non-transitory computer readable medium of claim 17, wherein the margin of error is 1%.

19. The non-transitory computer readable medium of claim 17, wherein the at least one system parameter is expected energy production.

20. The non-transitory computer readable medium of claim 15, wherein the module level power electronics is a DC-AC inverter.

* * * * *